(12) United States Patent
Monfray et al.

(10) Patent No.: US 12,293,981 B2
(45) Date of Patent: May 6, 2025

(54) ELECTRONIC CIRCUIT COMPRISING A RF SWITCHES HAVING REDUCED PARASITIC CAPACITANCES

(71) Applicants: STMicroelectronics (Crolles 2) SAS, Crolles (FR); STMicroelectronics International N.V., Geneva (CH)

(72) Inventors: Stephane Monfray, Eybens (FR); Siddhartha Dhar, Grenoble (FR); Alain Fleury, Barberaz (FR)

(73) Assignees: STMicroelectronics (Crolles 2) SAS, Crolles (FR); STMicroelectronics International N.V., Geneva (CH)

( * ) Notice: Subject to any disclaimer, the term of this patent is extended or adjusted under 35 U.S.C. 154(b) by 171 days.

(21) Appl. No.: 17/733,589

(22) Filed: Apr. 29, 2022

(65) Prior Publication Data

US 2022/0359435 A1 Nov. 10, 2022

(30) Foreign Application Priority Data

May 6, 2021 (FR) ...................................... 2104781

(51) Int. Cl.
    *H01L 23/66* (2006.01)
    *H01L 21/48* (2006.01)
    (Continued)

(52) U.S. Cl.
    CPC .......... *H01L 23/66* (2013.01); *H01L 21/4882* (2013.01); *H01L 23/3736* (2013.01);
    (Continued)

(58) Field of Classification Search
CPC . H01L 23/66; H01L 21/4882; H01L 23/3736; H01L 23/42; H01L 2223/6677; H01L 23/485; H01L 23/367; H01L 23/5222; H01L 23/53295; H01L 23/3677; G11C 13/0004; H10N 70/8413
See application file for complete search history.

(56) References Cited

U.S. PATENT DOCUMENTS

2008/0266787 A1* 10/2008 Gosset .................. H01L 23/473
    257/E21.573
2015/0069571 A1* 3/2015 Gambino .......... H01L 21/76224
    438/437

(Continued)

*Primary Examiner* — Patricia D Valenzuela
(74) *Attorney, Agent, or Firm* — Seed IP Law Group LLP

(57) ABSTRACT

The present disclosure relates to an electronic circuit comprising a semiconductor substrate, radiofrequency switches corresponding to MOS transistors comprising doped semiconductor regions in the substrate, at least two metallization levels covering the substrate, each metallization level comprising a stack of insulating layers, conductive pillars topped by metallic tracks, at least two connection elements each connecting one of the doped semiconductor regions and formed by conductive pillars and conductive tracks of each metallization level. The electronic circuit further comprises, between the two connection elements, a trench crossing completely the stack of insulating layers of one metallization level and further crossing partially the stack of insulating layers of the metallization level the closest to the substrate, and a heat dissipation device adapted for dissipating heat out of the trench.

20 Claims, 7 Drawing Sheets

(51) Int. Cl.
*H01L 23/373* (2006.01)
*H01L 23/42* (2006.01)
*G11C 13/00* (2006.01)
*H10N 70/00* (2023.01)

(52) U.S. Cl.
CPC .......... *H01L 23/42* (2013.01); *G11C 13/0004* (2013.01); *H01L 2223/6677* (2013.01); *H10N 70/8413* (2023.02)

(56) References Cited

U.S. PATENT DOCUMENTS

2018/0151471 A1    5/2018   Cook et al.
2019/0140176 A1*   5/2019   Arnaud ............. H10N 70/8413

\* cited by examiner

ELECTRONIC CIRCUIT COMPRISING A RF SWITCHES HAVING REDUCED PARASITIC CAPACITANCES

BACKGROUND

Technical Field

The present disclosure generally relates to electronic circuits and, more particularly, to electronic circuits comprising RF switches.

Description of the Related Art

A radiofrequency switch, or RF switch, is a device to route high frequency signals through transmission paths. RF switches can be made by metal-oxide-semiconductor field-effect transistors, called MOS transistors hereafter.

An electronic circuit comprising RF switches are for example used in a front-end device that incorporates all the circuitry between the antenna and at least one mixing stage of a receiver and or the power amplifier of an emitter. These electronic circuits are used in a wide variety of RF products and applications. Examples include wireless systems and FM radio systems.

It is desirable that both the parasitic capacitances and the On-Resistance of the RF switch are as low as possible.

BRIEF SUMMARY

An embodiment overcomes all or part of the disadvantages of known electronic circuits comprising RF switches.

One embodiment provides an electronic circuit comprising a semiconductor substrate, radiofrequency switches corresponding to MOS transistors comprising doped semiconductor regions in the substrate, at least two metallization levels covering the substrate, each metallization level comprising a stack of insulating layers, conductive pillars topped by metallic tracks, at least two connection elements each connecting one of the doped semiconductor regions and formed by conductive pillars and conductive tracks of each metallization level, the electronic circuit further comprising, between the two connection elements, a trench crossing completely the stack of insulating layers of one metallization level and further crossing partially the stack of insulating layers of the metallization level the closest to the substrate, and a heat dissipation device adapted for dissipating heat out of the trench.

According to one embodiment, the heat dissipation device is also a moisture-proof protection device adapted for preventing moisture from reaching the insulating layers exposed in the trench.

According to one embodiment, the trench has a height greater than or equal to 1 µm (micrometers). According to one embodiment, the trench has a height greater than 1 µm.

According to one embodiment, the trench has an average width greater than or equal to 100 nm (nanometers). According to one embodiment, the trench has an average width greater than 100 nm According to one embodiment, the heat dissipation device comprises a coating covering the lateral faces of the trench.

According to one embodiment, the coating is moisture-proof.

According to one embodiment, the thickness of the coating varies from 10 nm to 500 nm.

According to one embodiment, the coating is made of a good thermal conductive material or materials.

According to one embodiment, the coating is made of aluminum nitride, molybdenum disulfide, graphene, and/or silicon with ceramic particles.

According to one embodiment, the trench is at least partially filled with air, a gas, a gas mixture, or a partial void.

According to one embodiment, the heat dissipation device comprises a plug filling at least partially the trench.

According to one embodiment, the plug is moisture-proof.

According to one embodiment, the heat dissipation device comprises a lid obturating the top of the trench.

According to one embodiment, the lid is moisture-proof.

One embodiment provides a system comprising an antenna and an electronic circuit as previously defined linked to the antenna.

One embodiment provides a manufacturing method of an electronic circuit comprising a semiconductor substrate, radiofrequency switches corresponding to MOS transistors comprising doped semiconductor regions in the substrate, at least two metallization levels covering the substrate, each metallization level comprising a stack of insulating layers, conductive pillars topped by metallic tracks, at least two connection elements each connecting one of the doped semiconductor regions and formed by conductive pillars and conductive tracks of each metallization level, the method comprising forming, between the two connection elements, a trench crossing completely the stack of insulating layers of one metallization level and further crossing partially the stack of insulating layers of the metallization level the closest to the substrate, and forming a heat dissipation device adapted for dissipating heat out of the trench.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the electronic devices implementing electronic circuit having RF switches have not been detailed, the described embodiments being compatible with usual applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to qualifiers of relative position, such as the terms "above," "below," "upper," "lower," "inferior," "superior," etc., reference is made unless specified otherwise to the orientation of the figures or to an electronic circuit in a normal position of use.

Unless specified otherwise, the expressions "around," "approximately," "substantially" and "in the order of" signify within 10%, and preferably within 5%. Moreover, unless specified otherwise, it is considered here that the terms "insulating" and "conductive" mean respectively "electrically insulating" and "electrically conductive."

In the following description, a film or a layer is said to be moisture-proof when the permeability of the film or of the layer to water at 40° C. is less than $10^{-1}$ g/(m²*day). The moisture permeability can be measured according to the Highly Accelerated Stress Test (HAST), which may follow the standard operating JEDEC preconditioning procedure JESD 22A113.

In the following description, a material is said to be a good thermal conductor, or a good heat conductor, when the thermal conduction coefficient of the material is greater than or equal to 140 W/(m·K).

Figure 1:
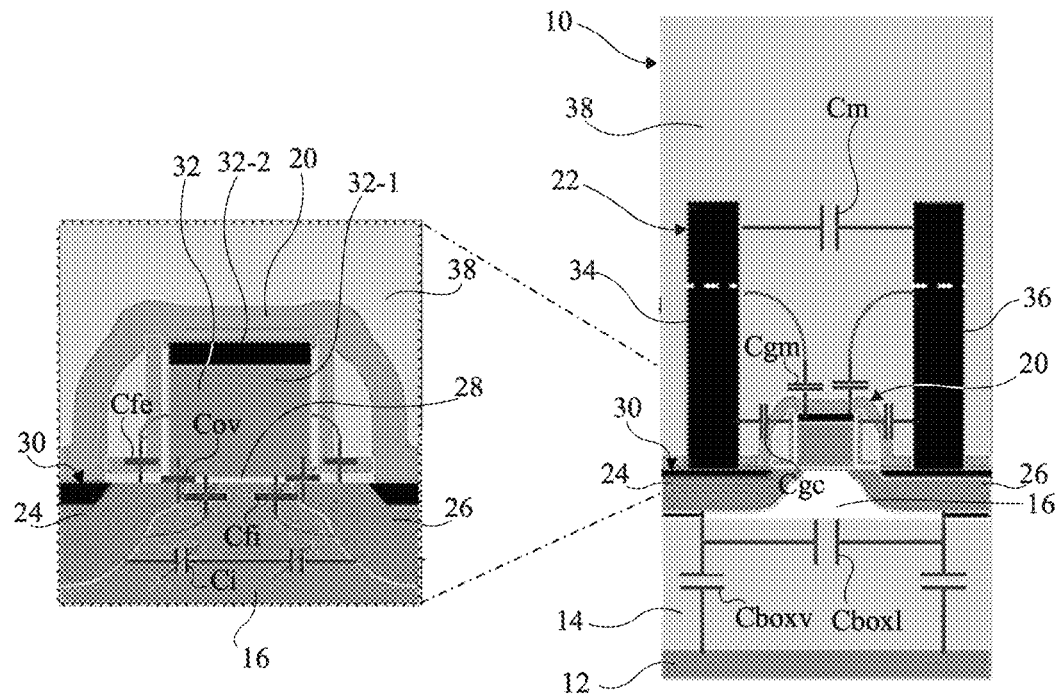
FIG. 1 illustrates parasitic capacitances of an electronic circuit comprising a radio-frequency (RF) switch.

FIG. 1 illustrates some parasitic capacitances that need to be considered during the conception of an electronic circuit comprising RF switches made by MOS transistors. FIG. 1 shows, in right side, a cross-section of an electronic circuit 10, and, in left side, a detailed view of electronic circuit 10.

Electronic circuit 10 comprises a semiconductor base 12, an insulating layer 14 sandwiched between the base 12 and a semiconductor substrate 16 corresponding to a semiconductor layer, an RF switch corresponding to a MOS transistor 20, and connection elements 22. As a variation, semiconductor base 12, insulating layer 14, and semiconductor layer 16 can be replaced by a single semiconductor substrate.

Transistor 20 comprises drain and source semiconductor regions 24, 26 formed in and on semiconductor layer 16, a gate insulator 28 on a face 30 of semiconductor layer 16, and a conductive gate 32 covering gate insulator 28. Conductive gate 32 may have a multilayer structure, for example comprising a stack of two layers 32-1 and 32-2. Connection elements 22 comprise connection elements 34 contacting drain region 24 and connection elements 36 contacting source region 26. Connection elements 34, 36 extend through a stack 38 of insulating layers covering face 30.

Some of the parasitic capacitances to be considered are:
capacitance Cm between connection elements 34 and 36;
capacitances Cgm between an upper part of connection elements 34, 36 and gate 32;
capacitances Cgc between a lower part of connection elements 34, 36 and gate 32;
capacitance Cboxl between drain region 24 and source region 26 through insulating layer 14;
capacitances Cboxv between drain region 24 and base 15 and between source region 26 and base 12;
capacitances Cfe between drain region 24 and gate 32 and between source region 26 and gate 32 through insulating spacers;
capacitances Cfi between drain region 24 and gate 32 and between source region 26 and gate 32 through semiconductor layer 16 and gate insulator 28;
capacitances Ci between drain region 24 and source region 26 through semiconductor layer 16; and
capacitances Cov between drain region 24 and gate 32 and between source region 26 and gate 32 through gate insulator 28.

It is to be noted that capacitances Cov, Cfi, and Ci depend on the voltages applied to drain region 24, source region 26, and/or gate 32. Capacitance symbol Cm is usually used for connection elements 34 and 36 of the first metallization level. For connection elements 34 and 36 made of parts of several metallization levels, symbol CBEOL may be used to include all the parasitic capacitances between the different parts of the connection elements 34 and 36. Capacitance CBEOL therefore includes capacitance Cm.

Usually, in order to compare the performances of different RF switches, two coefficients Ron and Coff are used. Coefficient Coff is a capacitance that can be defined by the following relation:

$$Coff=(Cgd+Ci+Cboxv)/2+Cm+Cboxl$$

with:

$$Cgd=Cov+Cfi+Cfe+Cgc+Cgm$$

Coefficient Ron corresponds to the electrical resistivity of the canal of transistor 20 in the On state. In particular, it is usually desirable that the product of coefficients Ron and Coff is as low as possible.

Figure 2:
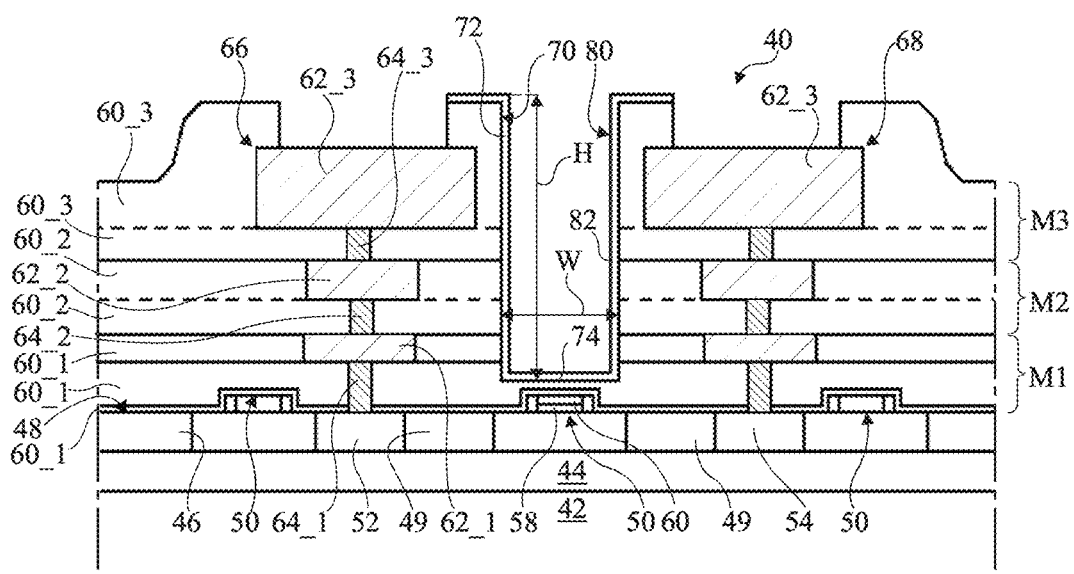
FIG. 2 partially and schematically shows a cross-section of an embodiment of an electronic circuit comprising RF switches.

FIG. 2 partially and schematically shows a cross-section of an embodiment of an electronic circuit 40.

Electronic circuit 40 comprises a semiconductor base 42, an insulating layer 44 sandwiched between the semiconductor base 42 and a semiconductor substrate 46 corresponding to a semiconductor layer having an upper face 48. Insulating blocks 49 can be provided in semiconductor layer 46 to laterally isolate portions of semiconductor layer 46.

Electronic circuit 40 comprises RF switches corresponding to MOS transistors 50, three transistors 50 being shown by way of example in FIG. 2.

Each transistor 50 comprises drain and source semiconductor regions 52, 54, corresponding to doped regions formed in semiconductor layer 46, a gate insulator 58 on face 48, and a conductive gate 60 covering gate insulator 58. For example, the semiconductor regions 52, 54 may be a first doped region 52 and a second doped region 54. One of the first and second doped regions 52, 54 is a gate region and the other is a drain region. The connection of the transistors is achieved by conductive tracks of successive metallization levels. Electronic circuit 40 comprises at least a stack of two metallization levels, preferably at least a stack of three metallization levels. As an example, in FIG. 2, three metallization levels M1, M2 and M3 are shown. The first metallization level M1 is the closest to semiconductor layer 46 relative to the second and third metallization levels M2, M3, respectively. The metallization levels M1, M2 and M3 have similar structures. Therefore, an element which is present in each metallization level M1, M2, and M3 is hereafter designated with a reference comprising a suffix _1,_2,_3 according to the metallization level M1, M2, or M3 to which belongs this element.

For each metallization level M1, M2 and M3, electronic circuit 40 comprises:

a stack of two insulating layers 60_1, 60_2, 60_3, or a stack more than two insulating layers 60_1, 60_2, 60_3. The insulating layers 60_1, 60_2, 60_3 of the stack can be made of the same material or be made of different materials;

conductive tracks 62_1, 62_2, 62_3 in the uppermost insulating layer 60_1, 60_2, 60_3 of the metallization level M1, M2, M3; and junction elements 64_1, 64_2, 64_3, corresponding for example to conductive pillars, connecting the respective conductive track 62_1, 62_2, 62_3 of the respective metallization level M1, M2, M3 to the respective conductive track of an adjacent one of the respective metallization levels M1, M2, M3 or to the gate 60, the drain region 52, or the source region 54 of one of transistors 50.

For each transistor 50, electronic circuit 40 comprises a connection element 66 contacting drain region 52 and a connection element 68 contacting source region 54. Connection elements 66, 68 are made of conductive tracks 62_1, 62_2, 62_3 and junction elements 64_1, 64_2, 64_3 of the three metallization layers M1, M2, and M3 that are electrically connected together.

As an example, semiconductor layer 46 is a silicon layer. The thickness of semiconductor layer 46 can vary from 10 nm to 200 nm. The thickness of insulating layer 44 can vary from 15 nm to 400 nm. Gates 60 of transistors 50 can be made of polycrystalline silicon or of metal. The thickness of gates 60 can vary from 30 nm to 200 nm.

The total thickness of first metallization level M1 can vary from 100 nm to 600 nm. The total thickness of second metallization level M2 can vary from 100 nm to 1 µm. The total thickness of third metallization level M3 can vary from 100 nm to 5 µm. The insulating layers 44, 60_1, 60_2, 60_3 can be made of silicon oxide (SiO2), silicon nitride (SiN), silicon carbon nitride (SiCN), or any silicon oxide etch stop layer. The thickness of first conductive tracks 62_1 can vary from 100 nm to 1 µm. The thickness of first junction elements 64_1 can vary from 100 nm to 1 µm. The thickness of second conductive tracks 62_2 can vary from 100 nm to 1 µm. The thickness of second junction elements 64_2 can vary from 100 nm to 1 µm. The thickness of third conductive tracks 62_3 can vary from 100 nm to 5 µm. The thickness of third conductive junction elements 64_3 can vary from 100 nm to 2 µm. Conductive tracks 62_1, 62_2, 62_3 and junction elements 64_1, 64_2, 64_3 can be made of a metal or a metallic alloy, for example of aluminum (Al), copper (Cu), tungsten (W), AlCu alloy, or Cu alloy. Conductive tracks 62_1, 62_2, 62_3 and junction elements 64_1, 64_2, 64_3 may not be made of the same material. For example, conductive tracks 62_1 may be made of Cu whereas conductive tracks 62_2 and 62_3 may be made of Al.

Electronic circuit 40 comprises trenches, one trench 70 being shown in FIG. 2 extends into all the insulating layers 60_1, 60_2, 60_3 of the metallization levels M1, M2. The trench 70 stops in the insulating layers 60_1 such that the trench 70 has an end within the insulating layer 60_1. Trench 70 comprises lateral walls 72 and a bottom wall 74. The height H of trench 70 varies from 1 µm to 10 µm. The average width W of trench 70, which is the distance between two opposite lateral walls 72, varies from 100 nm to 3 µm. Lateral walls 72 of trench 70 may be substantially parallel or can be inclined with respect to each other. For example, in some embodiments, the width of trench 70 is bigger at the top of trench 70 than at the bottom of trench 70 such that the trench 70 is tapered due to the inclined sidewalls.

Trench 70 is filled with one or more materials, and/or air so that the region corresponding to the volume inside trench 70 has an average relative permittivity that is inferior to the relative permittivity of the material composing the insulating layers 60_1, 60_2, 60_3. According to an embodiment, the region corresponding to the volume inside trench 70 is electrically insulating.

Electronic circuit 40 comprises, for each trench 70, a heat dissipation device or structure 80 allowing thermal dissipation, and is preferably also moisture-proof for preventing moisture from reaching the insulating layers 60_1, 62_2, 60_3 exposed in trench 70. In other words, there may be a one to one relationship between the trenches 70 and the heat dissipation devices 80. In the present embodiment, heat dissipation device 80 comprises a heat dissipation coating 82, that can also be moisture-proof, covering lateral walls 72 and bottom wall 74 of trench 70, and in contact with lateral walls 72 (e.g., sidewalls) and bottom wall 74 of trench 70. The rest of trench 70 can be filled with air, gas, or fluid. Coating 82 can have a monolayer structure or a multilayer structure. The thickness of coating 82 varies from 10 nm to 500 nm. Coating 82 is made of a good heat conductor material, so that coating 82 improves the heat dissipation. Coating 82 can comprise a layer made of aluminum nitride (AlN), molybdenum disulfide ($MoS_2$), graphene, and/or silicon with ceramic particles, for example AlN particles. Coating 82 can have a multilayer structure, for example comprising an AlN layer, or an equivalent layer, and a silicon nitride (SiN) layer.

Electronic circuit 40 can comprise a trench 70 for each MOS transistor 50, trench 70 being interposed between connection elements 66 and 68 associated to this transistor 50. Electronic circuit 40 can comprise trenches 70 interposed between connection elements 66 and 68 associated to different transistors 50.

Trenches 70 can be manufactured by an etching process, for example deep reactive ion etching (DRIE), focused ion beam (FIB), or laser assisted etching. Coating 82 can be manufactured by a conformal deposition process, for example physical vapor deposition (PVD), chemical vapor deposition (CVD), atomic layer deposition (ALD), or plasma enhanced atomic layer deposition (PEALD).

Figure 3:
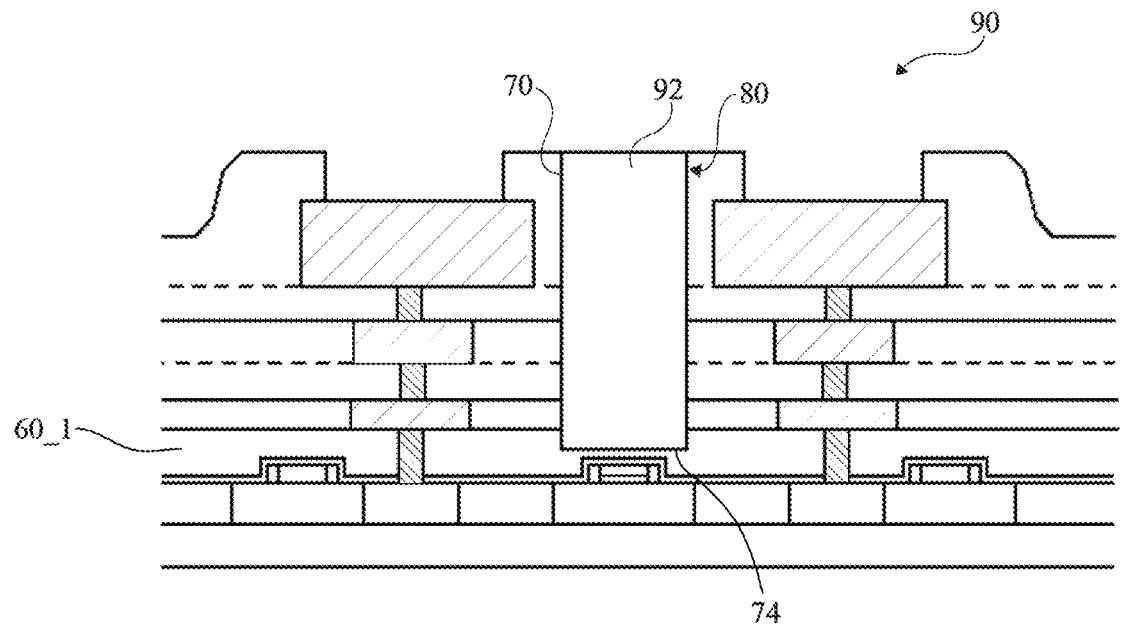
FIG. 3 partially and schematically shows a cross-section of another embodiment of an electronic circuit comprising RF switches.

FIG. 3 partially and schematically shows a cross-section of another embodiment of an electronic circuit 90. Electronic circuit 90 comprises all the elements of electronic circuit 40 shown in FIG. 2 except that heat dissipation device 80 corresponds to a plug 92 filling trench 70. Plug 92 can also be moisture-proof. Preferably, plug 92 fills completely trench 70 from the bottom up to the top of trench 70.

As a variation, the plug 92 may not completely fill trench 70, and, instead, the bottom of trench 70 may be filled with air, a gas, a gas mixture, a fluid, or a partial void. For example, the plug 92 may cover an upper end of a gap that is at a bottom of the trench such that a lower end of the plug is raised above a bottom wall 74 (see FIG. 3) of the insulating layer 60_1. The bottom wall 74 may be referred to as a surface. Plug 92 can be made of a polymer, for example polyimide (PI), or polybenzoxazole (PBO), possibly charged with particles of a good heat conductor material. Preferably, plug 92 is made of a good heat conductor material. Plug 92 can be made of AlN, for example deposited by spin coating techniques.

Figure 4:
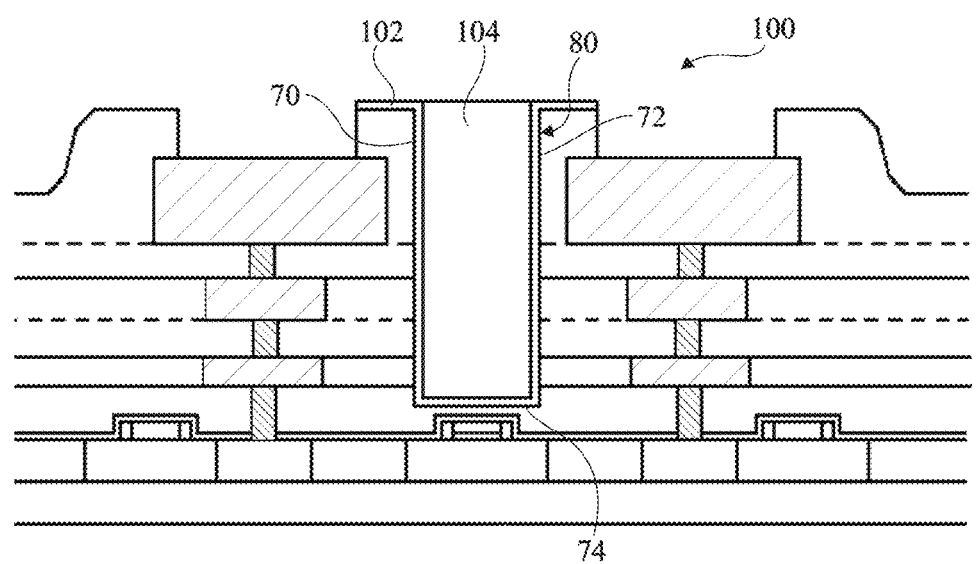
FIG. 4 partially and schematically shows a cross-section of another embodiment of an electronic circuit comprising RF switches.

FIG. 4 partially and schematically shows a cross-section of another embodiment of an electronic circuit 100. Electronic circuit 100 comprises all the elements of electronic circuit 40 except that heat dissipation device 80 comprises a coating 102 covering lateral walls 72 and bottom wall 74 of trench 70, and in contact with lateral walls 72 and bottom wall 74 of trench 70, and a plug 104 filling completely the rest of trench 70 up to the top of trench 70. Coating 102 can have a monolayer structure or a multilayer structure. Coating 102 may be moisture-proof and plug 104 may not be moisture-proof. As a variation, coating 102 may not be moisture-proof and plug 104 may be moisture-proof. As a variation, coating 102 may be moisture-proof and plug 104 may be moisture-proof. As a variation, the plug 92 may not fill completely trench 70, the bottom of trench 70, between plug 104 and coating 102 being filled with air, a gas, a gas mixture, or a partial void. In other words, a gap may be between the plug 104 and the coating 102 at the bottom end of the plug 104. In that case, coating 102 is preferably moisture-proof. The thickness of coating 102 varies from 10 nm to 500 nm. Coating 102 can comprise a layer made of AlN, $MoS_2$, graphene, and/or silicon with ceramic particles, for example AlN particles. Coating 102 can have a multilayer structure, for example comprising an AlN layer, or an equivalent layer, and a silicon nitride (SiN) layer. Plug 104 can be made of a polymer, for example polyimide or PBO. Preferably, coating 102 is made of a good heat conductor material. Preferably, plug 104 is made of a good heat conductor material.

Figure 5:
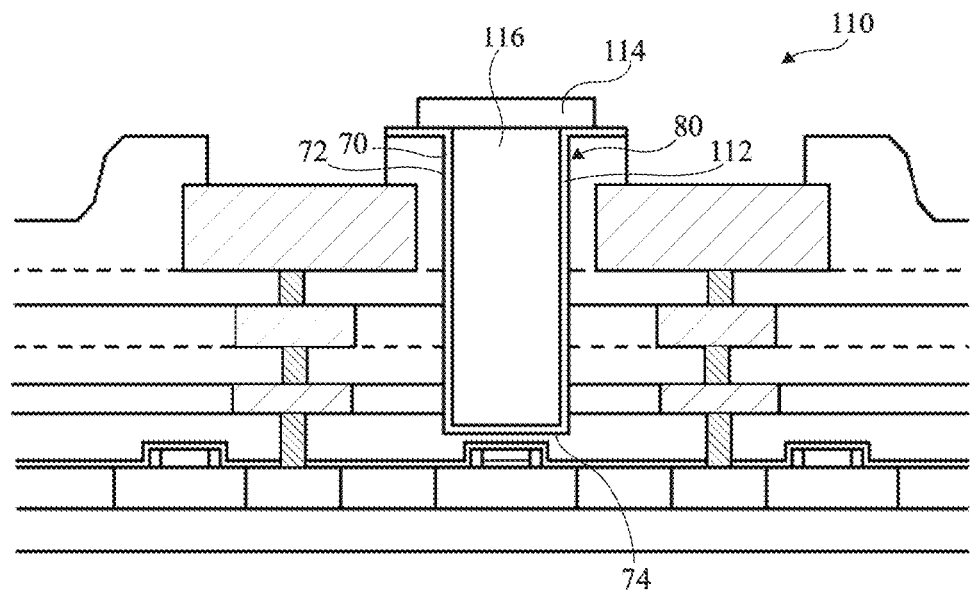
FIG. 5 partially and schematically shows a cross-section of another embodiment of an electronic circuit comprising RF switches.

FIG. 5 partially and schematically shows a cross-section of another embodiment of an electronic circuit 110. Electronic circuit 110 comprises all the elements of electronic circuit 40 except that heat dissipation device 80 comprises a coating 112 covering lateral walls 72 and bottom wall 74 of trench 70, and in contact with lateral walls 72 and bottom wall 74 of trench 70, and a lid 114 obturating, covering, or closing off the top of trench 70. A gap 116 in the trench 70 between coating 112 and lid 114 can contain air, a gas, a gas mixture, or a partial void. As a variation, the gap 116 of trench 70 between coating 112 and lid 114 can instead be filled, completely or partially by a plug the same or similar to the plugs 92, 104 as discussed with respect to FIGS. 3 and 4 earlier herein. Coating 112 may be moisture-proof and lid 114 may not be moisture-proof. As a variation, coating 112 may not be moisture-proof and lid 114 may be moisture-proof. As a variation, coating 112 may be moisture-proof and lid 114 may be moisture-proof. The thickness of coating 112 varies from 10 nm to 500 nm. Coating 112 can comprise a layer made of AlN, $MoS_2$, graphene, and/or silicon with ceramic particles, for example AlN particles. Coating 112 can have a multilayer structure, for example comprising an AlN layer, or an equivalent layer, and a silicon nitride (SiN) layer. Lid 114 can be made of a polymer, for example polyimide or PBO. The thickness of lid 114 varies from 200 nm to 3 µm. Preferably, coating 112 is made of a good heat conductor material.

Figure 6:
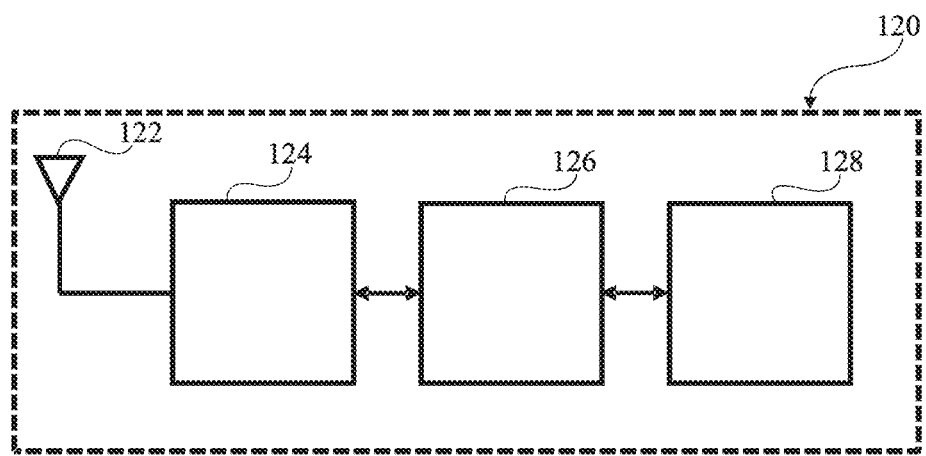
FIG. 6 is a block diagram of an electronic device.

FIG. 6 is a block diagram of an electronic device 120 comprising an antenna 122, a front-end module 124, a transceiver 126, and a microprocessor 128. Microprocessor 128 exchanges signals with transceiver 126. Transceiver 126 exchanges signals with front-end module 124. Front-end module 124 controls antenna 122 for the emission of radiofrequency waves or receives radiofrequency signals received by antenna 122. The previously disclosed embodiments of electronic circuits 40, 90, 100, 110 can be implemented to manufacture front-end module 124.

First and second simulations were carried out. First simulations aim at showing the reduction of parasitic capacitance CBEOL of transistor, and hence coefficient Coff, when a trench as previously disclosed is provided between connection elements.

Figure 7:
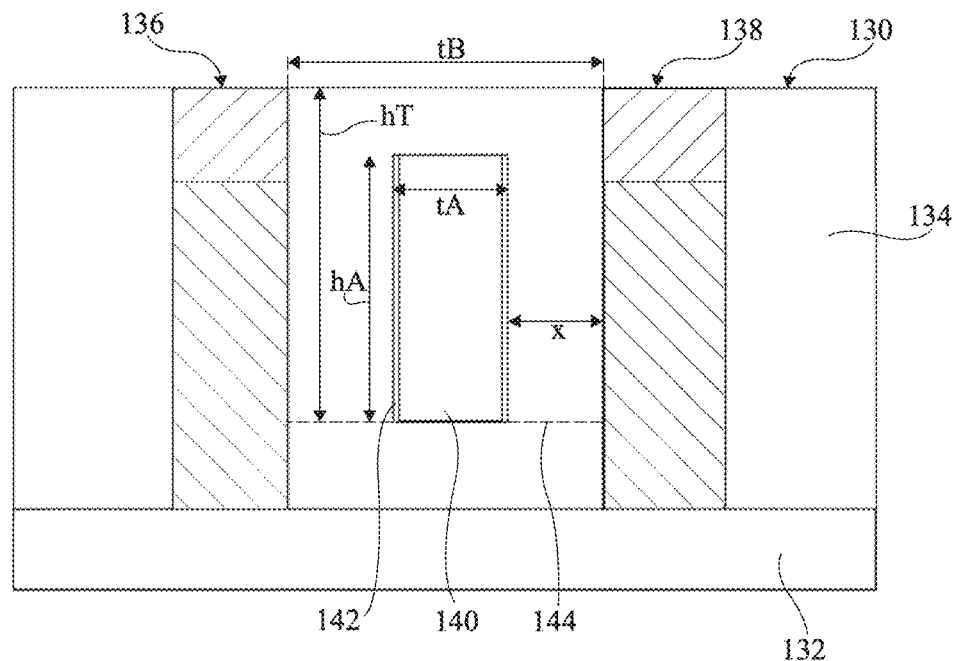
FIG. 7 shows a cross-section of an electronic circuit used to carry out first simulations.

FIG. 7 shows a cross-section of an electronic circuit 130 used to carry out the first simulations. Electronic circuit 130 comprises a semiconductor substrate 132 covered by an insulating layer 134. Two connection elements 136, 138 extend through the insulating layer 134. For the first simulations, each connection element 136, 138 is made of parts of the first metallization level, that is a conductive track of the first metallization level and the junction element between the conductive track and substrate 132. The two connection elements 136, 138 are separated by distance tB from 100 nm to 1 µm. A trench 140 is present in the insulating layer 134. Trench 140 has a height hA and width tA. Lateral walls of trench 140 are covered by a layer 142 of AlN. The thickness of layer 142 is equal to 50 nm. The rest of trench 140 is filled with air. Trench 140 is at equal distance x from each connection element 136, 138. The height hT is the distance between the bottom of trench 140 and the upper face of insulating layer 134. A parasitic capacitance CBEOL was determined by simulation for a region 144 between two connection elements 136, 138, including trench 140, and with height hT.

Figure 8:
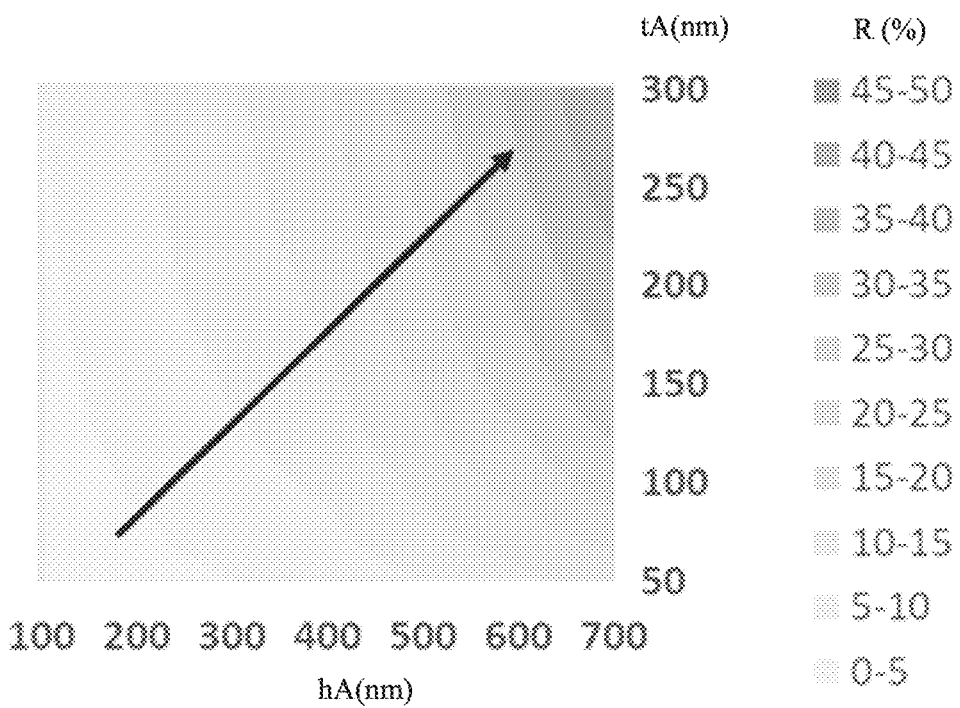
FIG. 8 is a grayscale map of the reduction of parasitic capacitance CBEOL with respect to the height and the width of the trench of the electronic circuit shown in FIG. 7 with a trench without coating.

FIG. 8 is a grayscale map of the reduction R (in %), of parasitic capacitance CBEOL with respect to height hA and width tA of trench 140 of electronic circuit 130 shown in FIG. 7 when coating 142 is not present. It appears that a decrease of capacitance CBEOL superior to 45% is obtained when the volume of trench 140 is superior to 60% of the volume of region 144. This results in a decrease of coefficient Coff superior to 20%, considering that parasitic capacitance CBEOL corresponds substantially to 45% of parasitic capacitance Coff. Since the coefficient Ron is not affected by the presence of trench 140, a decrease of product Ron*Coff is obtained.

Figure 9:
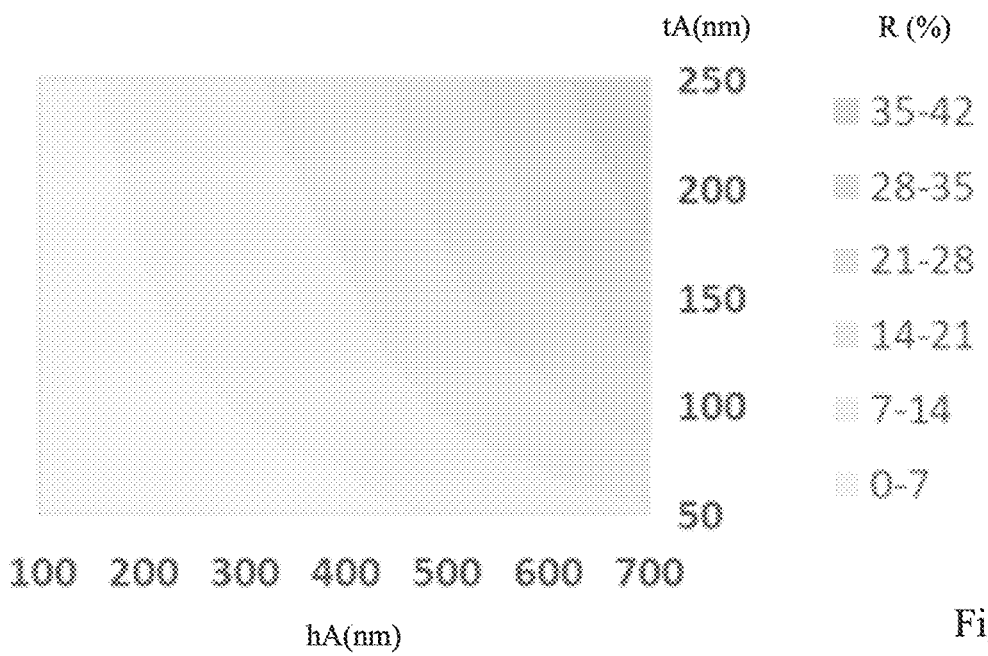
FIG. 9 is a grayscale map of the reduction of parasitic capacitance CBEOL with respect to the height and the width of the trench of the electronic circuit shown in FIG. 7 with a trench with a coating.

FIG. 9 is a grayscale map of the reduction R (in %), of parasitic capacitance CBEOL with respect to height hA and width tA of trench 140 of electronic circuit 130 shown in FIG. 7 when coating 142 is present. It appears that a decrease of capacitance CBEOL superior to 40% is obtained when the volume of trench 140 is greater than 50% of the volume of region 144. This results in a decrease of coefficient Coff greater than 18%, considering that parasitic capacitance CBEOL corresponds substantially to 45% of parasitic capacitance Coff. Since the coefficient Ron is not affected by the presence of trench 140, a decrease of product Ron*Coff is obtained.

It appears that it is advantageous that the trench has the highest height possible for the reduction of parasitic capacitance CBEOL. In the embodiments previously disclosed in relation to FIGS. 2, 3, 4, and 5, trench 70 extends through all the metallization levels (e.g., M2, M3) of the electronic circuit other than the first metallization level (e.g., M1), and extends through a part of the first metallization level (e.g., M1), that is into the insulating layers 60_1 such that the trench 70 has the highest height possible. The reduction of parasitic capacitance CBEOL with the embodiments previously disclosed in relation to FIGS. 2, 3, 4, and 5 is therefore higher than the reduction of the parasitic capacitance CBEOL that could be achieved with a trench filled with air extending only in the first metallization level or in the first and second metallization levels and covered by the insulating layers of ones of the metallization levels.

Moreover, the manufacture process of trench 70 in the embodiments previously disclosed in relation to FIGS. 2, 3, 4, and 5 comprises etching steps that are carried out after the manufacture of all the metallization levels. It hence only adds additional steps to an existing manufacture method but does not change the steps of the existing manufacture method. Moreover, the manufacture method of the electronic circuit shown in FIGS. 2, 3, 4, and 5 is simpler than the manufacture method of an electronic circuit in which the trench filled with air extends only in the first metallization level or in the first and second metallization levels, since in that latter case, the insulating layers of ones of the metallization levels are deposited on the trench, and it is necessary to adapt these steps to make sure that the depositions do not fill the trench and do not affect the performances of the electronic circuit.

Second simulations aim at showing that the implementation of the trench as previously disclosed can improve the evacuation of heat generated by an electronic component such as a MOS transistor.

Figure 10:
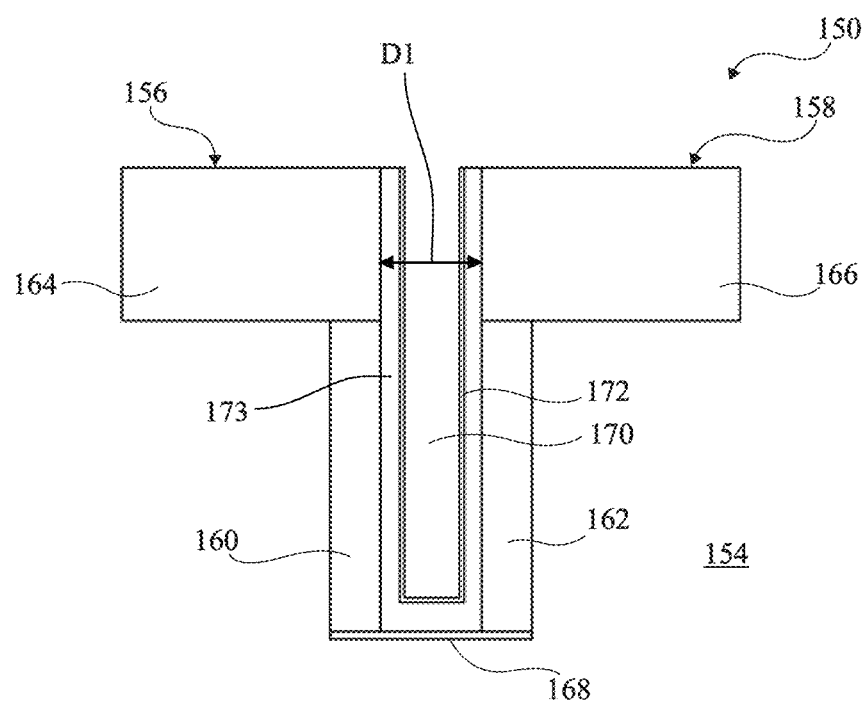
FIG. 10 shows a cross-section of an electronic circuit used to carry out second simulations.

FIG. 10 shows a cross-section of an electronic circuit 150 used to carry out the second simulations. The electronic circuit 150 comprises a Si base 152 covered by an insulating layer 154, which is made of $SiO_2$ in this situation. Two connection elements 156, 158 extend through insulating layer 154. For the second simulations, each connection element 156, 158 is considered as a Cu pillar 160, 162 topped by a Cu track 164, 166, the metallic pillars 160, 162 being parallel. The distance D1 between two connection elements 156, 158 is equal to 360 nm. The MOS transistor is simulated by a doped Si layer 168 connecting the bases of pillars 160, 162. A trench 170 filled with air is present in insulating layer 154. For the second simulations, trench 170 has a height of 3 µm and a width of 300 nm. Trench 170 is at equal distance from each connection element 156, 158. An AlN layer 172 covers the walls of trench 170. The thickness of layer 172 is equal to 50 nm. As shown in FIG. 10, in some embodiments, an insulating layer 173 may be present between respective sidewalls of tracks 164, 166 and the AlN layer 172.

Figure 11:
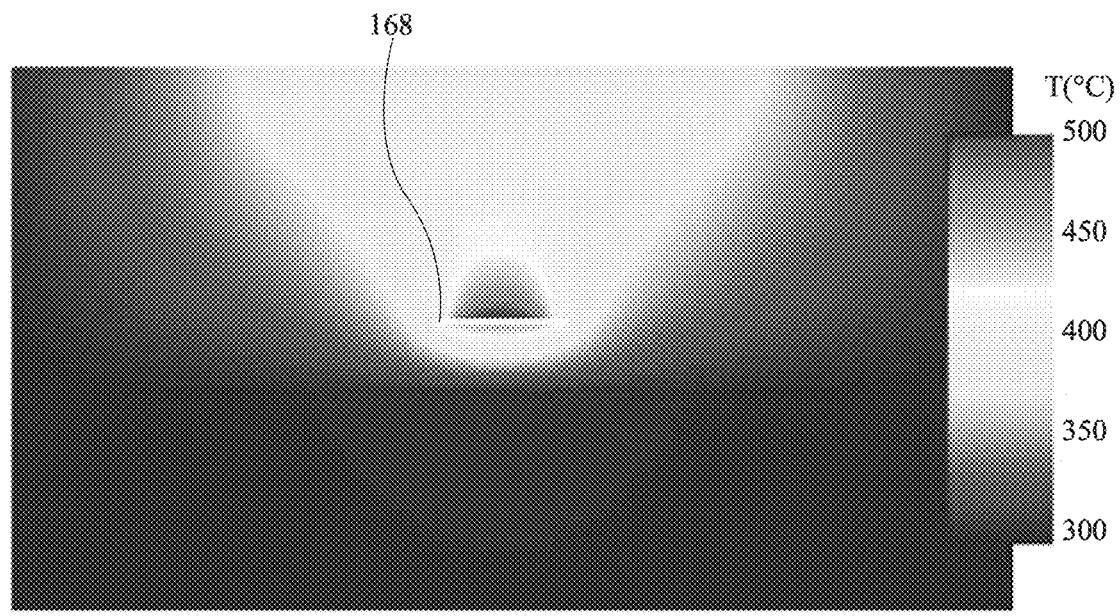
FIG. 11 is a grayscale map of the temperature in the electronic circuit shown in FIG. 10 without trench.
Figure 12:
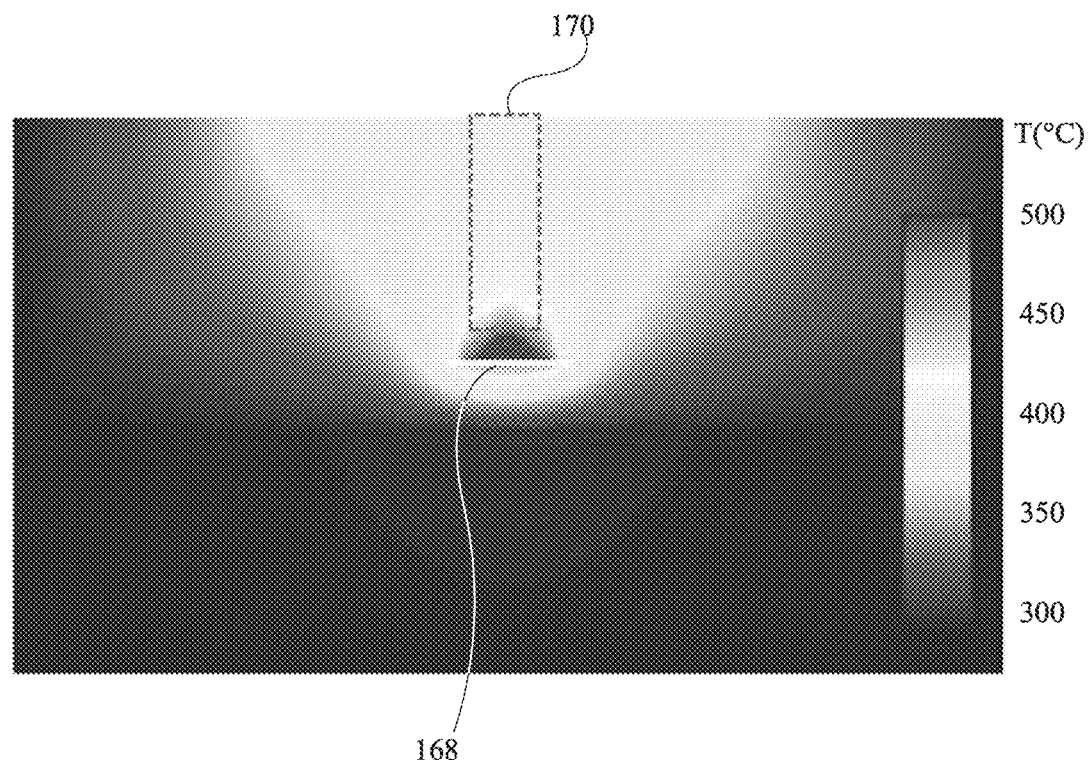
FIG. 12 is a grayscale map of the temperature in the electronic circuit shown in FIG. 10 with a trench without coating.
Figure 13:
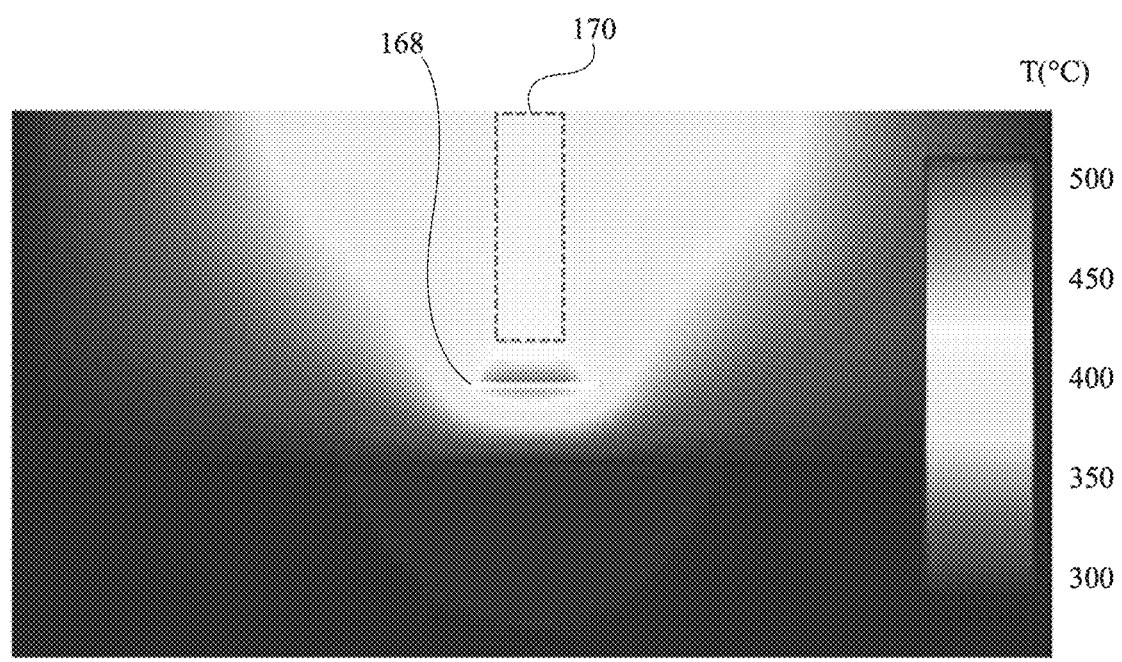
FIG. 13 is a grayscale map of the temperature in the electronic circuit shown in FIG. 10 with a trench with a coating.

FIGS. 11, 12, and 13 are grayscale maps of the temperature T in electronic circuit 150 in different configurations. In FIGS. 11, 12, and 13, the dark shade at the bottom of the Figures correspond to the lowest temperature and the dark shade adjacent to doped Si region 168 corresponds to the highest temperature. Pillars 160, 162 and tracks 164, 166 are not shown in FIGS. 11, 12, and 13.

FIG. 11 is a grayscale map of the temperature in electronic circuit 150 when trench 170 is not present, the space between pillars 160, 162 and between tracks 164, 166 being filled by $SiO_2$ layer 154.

FIG. 12 is a grayscale map of the temperature in electronic circuit 150 when trench 170 filled with air is present, but AlN layer 172 is not present. Trench 170 filled with air is not favorable for heat dissipation.

FIG. 13 is a grayscale map of the temperature in electronic circuit 150 when trench 170 is present, and AlN layer 172 is present. AlN layer 172 increases the heat dissipation with respect to the configuration when trench 170 is not present.

An electronic circuit (40; 90; 100; 110; 124) may be summarized as including a semiconductor substrate (46), radiofrequency switches corresponding to MOS transistors (50) including doped semiconductor regions (52, 54) in the substrate, at least two metallization levels (M1, M2, M3) covering the substrate, each metallization level including a stack of insulating layers (60_1, 60_2, 60_3), conductive pillars (64_1, 64_2, 64_3) topped by metallic tracks (62_1, 62_2, 62_3), at least two connection elements (66, 68) each connecting one of the doped semiconductor regions and formed by conductive pillars and conductive tracks of each metallization level, the electronic circuit further including, between the two connection elements, a trench (70) crossing completely the stack of insulating layers of one metallization level and further crossing partially the stack of insulating layers of the metallization level the closest to the substrate, and a heat dissipation device (80) adapted for dissipating heat out of the trench.

The heat dissipation device (80) may also be a moisture-proof protection device adapted for preventing moisture from reaching the insulating layers exposed in the trench (70).

The trench (70) may have a height (H) superior to 1 µm.

The trench (70) may have an average width (W) superior to 100 nm.

The heat dissipation device (80) may include a coating (82) covering the lateral faces (72) of the trench (70).

The coating (82) may be moisture-proof.

The thickness of the coating (82) may be from 10 nm to 500 nm.

The coating (82) may be made of a good thermal conductive material or materials.

The coating (82) may be made of aluminum nitride (AlN), molybdenum disulfide (MoS2), graphene, and/or silicon with ceramic particles.

The trench (70) may be at least partially filled with air, a gas, a gas mixture, or a partial void.

The heat dissipation device (80) may include a plug (92) filling at least partially the trench (70).

The plug (92) may be moisture-proof.

The heat dissipation device (80) may include a lid (114) obturating the top of the trench (70).

The lid (114) may be moisture-proof.

A system (120) may be summarized as including an antenna (122) and an electronic circuit (124) linked to the antenna.

A manufacturing method of an electronic circuit (40; 90; 100; 110; 124) may be summarized as including a semiconductor substrate (46), radiofrequency switches corresponding to MOS transistors (50) including doped semiconductor regions (52, 54) in the substrate, at least two metallization levels (M1, M2, M3) covering the substrate, each metallization level including a stack of insulating layers (60_1, 60_2, 60_3), conductive pillars (64_1, 64_2, 64_3) topped by metallic tracks (62_1, 62_2, 62_3), at least two connection elements (66, 68) each connecting one of the doped semiconductor regions and formed by conductive pillars and conductive tracks of each metallization level, the method including forming, between the two connection elements, a trench (70) crossing completely the stack of insulating layers of one metallization level and further crossing partially the stack of insulating layers of the metallization level the closest to the substrate, and forming a heat dissipation device (80) adapted for dissipating heat out of the trench.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a semiconductor substrate;
MOS (metal oxide semiconductor) transistors on the semiconductor substrate;
radiofrequency switches corresponding to the MOS transistors, the radiofrequency switches comprising:
doped semiconductor regions in the semiconductor substrate;
at least two metallization levels on the semiconductor substrate, each metallization level comprising:
a stack of insulating layers including an upper insulating layer with an upper surface facing away from the semiconductor substrate;
a conductive pillar extending through the stack of insulating layers;
a metallic track within the stacked insulating layers and coupled to the conductive pillars; and
at least two connection elements each connecting one of the doped semiconductor regions including ones of the conductive pillars and ones of the metallic tracks of the at least two metallization levels;
a trench between the two connection elements, the trench overlaps a first one of the MOS transistors on the semiconductor substrate, the trench is delimited by respective sidewalls of the stack of insulating layers and is delimited by a respective end surface of a respective insulating layer of the stack of insulating layers; and
a heat dissipation structure within the trench, the heat dissipation structure overlaps the first one of the MOS transistors, and the heat dissipation structure is configured to dissipate heat out of the trench, the heat dissipation structure including:
a heat dissipation coating extends along the respective end surface, extends along the respective sidewalls, and extends along the upper surface of the upper insulating layer; and
a plug in the trench and on the heat dissipation coating, the plug and the heat dissipation coating entirely filling the trench.

2. The device of claim 1, wherein:
the heat dissipation structure is moisture-proof, and is configured to prevent moisture from reaching the insulating layers through the trench.

3. The device of claim 1, wherein the trench has a height greater than or equal to 1 µm.

4. The device of claim 1, wherein the trench has an average width greater than or equal to 100 nm.

5. The device of claim 1, wherein the heat dissipation structure fully overlaps and completely overlaps the first one of the MOS transistors.

6. The device of claim 1, wherein the heat dissipation structure is moisture-proof.

7. The device of claim 1, wherein the thickness of the heat dissipation structure is 10 nm to 500 nm.

8. The device of claim 1, wherein the coating is made of from at least one of the following of aluminum nitride, molybdenum disulfide, graphene, and silicon with ceramic particles.

9. The device of claim 1, wherein the plug is moisture-proof.

10. The device of claim 1, further comprising a lid covering the heat dissipation structure.

11. The device of claim 10, wherein the lid is moisture-proof.

12. The device of claim 10, wherein the lid covering the heat dissipation structure is on a respective portion of the heat dissipation coating on the upper surface of the upper insulating layer of the stack of insulating layers.

13. The device of claim 1, further comprising:
a first opening in the upper insulating layer exposing a first surface of a first connection element of the at least two connection elements; and
a second opening in the upper insulating layer exposing a second surface of a second connection element of the at least two connection elements, and
wherein the heat dissipation coating extends from the trench to the first opening and extends from the trench to the second opening.

14. A device, comprising:
a substrate;
a first doped region and a second doped region in the substrate;
a plurality of transistors;
a plurality of stacked insulating layers on the substrate and on the plurality of transistors, an upper insulating layer of the plurality of stacked insulating layers includes an upper surface facing away from the substrate;
a first connection element extends into the plurality of insulating layers to the first doped region and is coupled to the first doped region;
a second connection element extends into the plurality of insulating layers to the second doped region and is coupled to the second doped region;
a trench between the first and second connection elements, the trench extends into the plurality of insulating layers, is delimited by respective sidewalls of the plurality of insulating layers, and overlaps a first one of the plurality of transistors, the trench includes an end surface that is spaced apart from the first one of the plurality of transistors, and the trench includes an opening exposed from the plurality of insulating layers;
a heat dissipation structure in the trench, the heat dissipation structure overlapping and aligned with a corresponding transistor of the plurality of transistors, and the heat dissipation structure further includes:
a heat dissipation coating extends along the respective end surface, extends along the respective sidewalls of the plurality of insulating layers, and extends along the upper surface of the upper insulating layer; and
a plug in a gap of the trench delimited by the heat dissipation coating, the plug and the heat dissipation coating entirely filling the trench;
a lid extends across the opening of the trench and is on a respective portion of the heat dissipation coating on the upper surface of the upper insulating layer.

15. The device of claim 14, wherein the trench has an average width greater than or equal to 100 nm.

16. The device of claim 14, wherein the heat dissipation structure fully overlaps and completely overlaps the first one of the plurality of transistors.

17. The device of claim 14, further comprising:
a first opening in the upper insulating layer exposing a first surface of the first connection element; and
a second opening in the upper insulating layer exposing a second surface of the second connection element, and
wherein the heat dissipation coating extends from the trench to the first opening and extends from the trench to the second opening.

18. A device, comprising:
a substrate;
a first doped region and a second doped region in the substrate, the second doped region spaced apart from the first doped region;
a first transistor on the first doped region;
a second transistor on the second doped region;
a third transistor on the substrate, the third transistor is between the first transistor and the second transistor;
a plurality of stacked insulating layers on the substrate, on the first transistor, and on the second transistor, the plurality stacked insulating layers including an upper insulating layer having an upper surface facing away from the substrate;
a first connection element extends into the plurality of stacked insulating layers to the first doped region and is coupled to the first doped region;
a second connection element extends into the plurality of stacked insulating layers to the second doped region and is coupled to the second doped region;
a trench extending into the plurality of insulating layers, the trench between the first connection element and the second connection element, the trench overlaps the third transistor, and the trench is delimited by an end surface defined by a respective insulating layer of the plurality of stacked insulating layers and by one or more sidewalls defined by respective insulating layers of the plurality of stacked insulating layers, and the one or more sidewalls terminate at the end surface;
a heat dissipation structure covering the end surface of the trench and covering the one or more sidewalls of the trench, the heat dissipation structure overlapping and aligned with third transistor, and the heat dissipation structure including:
a heat dissipation coating extends along the respective end surface, extends along the respective sidewalls of the plurality of insulating layers, and extends along the upper surface of the upper insulating layer; and
a plug in the trench and on the heat dissipation coating, the plug and the heat dissipation coating entirely filling the trench;
a lid extends across the plug in the trench and is on a respective portion of the heat dissipation coating on the upper surface of the upper insulating layer.

19. The device of claim 18, wherein the heat dissipation structure is moisture-proof.

20. The device of claim 18, further comprising:
a first opening in the upper insulating layer exposing a first surface of the first connection element; and
a second opening in the upper insulating layer exposing a second surface of the second connection element, and
wherein the heat dissipation coating extends from the trench to the first opening and extends from the trench to the second opening.

\* \* \* \* \*